United States Patent [19]

Kamath et al.

[11] 4,026,735
[45] May 31, 1977

[54] METHOD FOR GROWING THIN SEMICONDUCTING EPITAXIAL LAYERS

[75] Inventors: G. Sanjiv Kamath, Malibu; Hollen P. Mitchell, Newbury Park, both of Calif.

[73] Assignee: Hughes Aircraft Company, Culver City, Calif.

[22] Filed: Aug. 26, 1976

[21] Appl. No.: 717,806

[52] U.S. Cl. .............................. 148/171; 148/1.5; 148/172; 156/624; 252/62.3 GA
[51] Int. Cl.² ................................. H01L 21/208
[58] Field of Search ............... 148/171, 172, 1.5; 252/62.3 GA; 156/624

[56] References Cited

UNITED STATES PATENTS

| | | |
|---|---|---|
| 3,556,732 | 1/1971 | Chang et al. ............... 148/171 X |
| 3,663,722 | 5/1972 | Kamath ....................... 148/172 |
| 3,785,885 | 1/1974 | Stone .......................... 148/172 |
| 3,933,539 | 1/1976 | Gartman ..................... 148/171 |

*Primary Examiner*—G. Ozaki
*Attorney, Agent, or Firm*—William J. Bethurum; W. H. MacAllister

[57] ABSTRACT

The specification describes a liquid phase epitaxial (LPE) crystal growth process wherein semi-insulating epitaxial layers of gallium arsenide (GaAs) are formed on selected substrates by dipping the substrates into a saturated solution of GaAs in gallium. Prior to exposing the substrates to the above solution, the substrates are shielded by a nonreactive container of a material possessing a high thermal conductivity which, when immersed in the solution, serves to establish a thermal equilibrium between the substrate and the solution. This insures good nucleation in and crystal growth of the high quality semiconductor layers grown, and these layers may be grown to minimum thicknesses on the order of 0.2 micrometers or less with excellent control.

6 Claims, 4 Drawing Figures

METHOD FOR GROWING THIN SEMICONDUCTING EPITAXIAL LAYERS

FIELD OF THE INVENTION

This invention relates generally to semiconductor crystal growth processes and more particularly to a liquid phase epitaxial (LPE) crystal growth process featuring improved thermal and saturation equilibrium conditions in the solution from which epitaxial layers are grown.

BACKGROUND AND RELATED APPLICATION

As is well known in the art, it is desirable to fabricate many different types of semiconductor devices in very thin uniform layers of epitaxial GaAs. These devices include solar cells, field effect transistors, and various types of known GaAs microwave devices. In the fabrication of certain types of high frequency GaAs field effect transistors, for example, it is preferred to form the active transistor device regions in a very thin epitaxial layer of semi-insulating GaAs on the order of about 0.2 micrometers or less in thickness. One liquid phase epitaxial (LPE) process for forming such semi-insulating epitaxial GaAs layers is described in a copending application Ser. No. 530,336, assigned to the present assignee. Therefore, the desirability and preference to fabricate thin high quality epitaxial layers of GaAs under controlled conditions and at high yields are manifest.

PRIOR ART

There have been several different prior approaches in the crystal growth art for growing epitaxial layers from a molten source material, and certain ones of these processes involve dipping a GaAs substrate (wafer) into a solution of GaAs in gallium. One such process is described in the above copending application Ser. No. 530,336. In this process, a selected saturated solution is controllably cooled below its saturation temperature at a predetermined rate in order to epitaxially deposit a thin GaAs layer on a GaAs substrate. Other references which disclose the formation of epitaxial layers on GaAs substrates using liquid phase epitaxy include U.S. Pat. No. 3,785,885 to Stone, U.S. Pat. No. 3,846,191 to Blum et al., a book by P. J. Bulman et al. entitled *Transferred Electron Devices*, Academic Press, 1972, at page 324, et seq., and an article by Mutsuyuki Otsubo et al. entitled, "Chromium Doped Semi-Insulating Gallium Arsenide Crystals Grown By Liquid Phase Epitaxy," *Japanese Journal of Applied Physics*, Volume 13 (1974), No. 10, at pages 1655 and 1656.

While the LPE processes described in the above identified references have proven generally satisfactory for the fabrication of certain types of semiconductor devices, they have not proven entirely satisfactory in the fabrication of very thin high quality layers of epitaxial GaAs at reasonable yields. In particular, the direct dipping of the GaAs substrate into the molten material produces thermal shock at the substrate-solution interface and this, in turn, produces nonuniform nucleation and crystal growth when the epitaxial growth process begins. Such nonuniform nucleation and epitaxial growth thus imposes a limitation on both the quality and purity of the grown epitaxial layers and also a limitation on the quality of the semiconductor devices fabricated therein.

One process which has been utilized in an attempt to overcome the above-described problem of thermal shock produced in the direct dipping liquid phase epitaxial processes utilizes a so-called horizontal slide bar system, also referred to in the art as a limited melt system. Such a system is disclosed, for example, in an article by L. R. Dawson entitled, "Near Equilibrium LPE Growth of GaAs-Ga$_{1-x}$Al$_x$As Double Heterostructures," *Journal of Crystal Growth*, 27, (1974) pp 86–96. However, the so-called horizontal slide bar or limited melt systems, such as the one described in the above identified Dawson article, are not without their own disadvantages, which include the production of a substantial amount of waste material as a result of the horizontal nature of the process. Additionally, relatively large amounts of impurities such as carbon are frequently introduced into the melt a result of the horizontal nature and overall geometry of the system. That is, a horizontal slide bar system of the type described in the above Dawson article, as well as other similar systems, are usually characterized by a large apparatus surface area to solution (melt) volume ratio, and this increases the probability of introducing impurities such as carbon into the melt and reduces the reproducibility of the process. Furthermore, in contrast to the present invention to be described, the horizontal slide bar system is inherently more difficult to use because of the wiping movements which are required to bring the substrate into contact with the molten material.

Other disadvantages of using a horizontal slide bar system such as the one described by L. R. Dawson as noted above include: (1) the difficulty in wiping the slide bar apparatus clean, since gravity provides no help, (2) the inefficient use of the GaAs solution, since some of the solution is lost in the wiping of the horizontal slide bar, (3) the solution homogeneity is difficult to establish, since no stirring can take place using the horizontal slide bar, and (4) the solution is difficult to clean up and has to be baked clean every run to remove volatile impurities from the solution and from the graphite. This latter problem is substantially alleviated as a result of the solution homogeneity produced by stirring with the LPE system of the present invention.

THE INVENTION

The general purpose of this invention is to provide a new and improved liquid phase epitaxial process for fabricating very thin high quality layers of GaAs on selected substrates and at high yields. Our process utilizes a vertical dipping-type system which has eliminated the thermal shock problem described above, while simultaneously overcoming the above disadvantages associated with the horizontal slide bar systems. To achieve this purpose, we have developed a method by which the uniformity in both nucleation and crystal growth of the epitaxial layer has been greatly improved, thereby enhancing not only the process yields but also improving the quality (purity) of these layers. Furthermore, excellent thickness control is maintained over the grown semiconductor layers and this is advantageous from the standpoint of fabricating high frequency semiconductor devices in the grown layers.

Our discovery is embodied in a process which includes providing a solution of a selected semiconductive material, such as GaAs in gallium, at a predetermined elevated temperature, and initially enclosing a GaAs substrate in a nonreactive container made of a material such as graphite, having a known high thermal conductivity. This container is then immersed in the solution and the GaAs substrate is retained therein and shielded from the solution until substantial thermal equilibrium is established between the substrate and the solution. The solution is then cooled to slightly below its saturation equilibrium temperature at which epitaxial deposition would begin to occur in the solution. Thereafter, the semiconductor substrate is exposed to the solution where epitaxial growth on the GaAs substrate begins under process conditions of substantial thermal equilibrium and substantial saturation equilibrium between the substrate and the solution. In some LPE processes utilizing the present invention, it may be required to supersaturate the GaAs in Ga solution before exposing the substrate thereto in order to produce the most uniform LPE growth. Our system is uniquely adapted to accomplish the latter, since the substrate can be shielded until the desired solution temperature is reached. And, it should also be noted that the solution can be stirred for a desired period of time with the nonreactive graphite container to simultaneously insure uniformity and homogeneity of the growth solution.

Accordingly, it is an object of the present invention to provide a new and improved liquid phase epitaxial process for growing thin high quality and high purity layers of GaAs.

Another object is to provide a process of the type described for growing epitaxial layers of GaAs at high yields and under conditions which closely control the thicknesses of such layers.

Another object is to provide a process of the type described wherein the quality of the grown epitaxial layers is improved by improving the uniformity of both the nucleation and the growth of the epitaxial layers.

A further object is to provide a process of the type described which accomplishes the foregoing objects at a relatively low cost and which may be used with certain existing liquid phase epitaxial growth apparatus wherein a shielded wafer may be vertically dipped into a molten semiconductor material.

A further object is to provide a process of the type described which improves the homogeneity of the molten material from which the epitaxial layers are grown.

Yet another object of the invention is to provide a process of the type described which is characterized by improved temperature control of both the solution and the substrate, both prior to and during the epitaxial growth process. Furthermore, this process may be used for the crystal growth of many different types of III–V semiconductor compounds such as gallium aluminum arsenide, indium phosphide, etc.

These and other objects and features of the invention will become more readily apparent in the following description of the accompanying drawings.

DESCRIPTION OF THE DRAWINGS

Referring now to FIG. 1, there is shown a conventional LPE furnace member 10 having a central opening 12 therein for receiving an elongated hollow LPE crystal growth housing 14. The housing 14 includes a top chamber portion 15, and a pair of lower inner and outer walls 16 and 18 which extend downwardly into the opening 12 of the furnace member 10. A removable top cover 19 fits on top of the housing 14 and includes a central opening for receiving a vertical dipping rod 41 to be described. A gas inlet tube 20 extends between the walls 16 and 18 for receiving and passing a hydrogen gas, $H_2$, therebetween for maintaining a purified $H_2$ atmosphere before and during LPE crystal growth. This $H_2$ gas passes through a central annular opening 22 in the inner wall member 16 and then into the main hollow crystal growth chamber portion 23 of the LPE growth housing 14. The housing 14 further includes an $H_2$ gas outlet tube 24 through which the hydrogen gas may exit.

Figure 1:
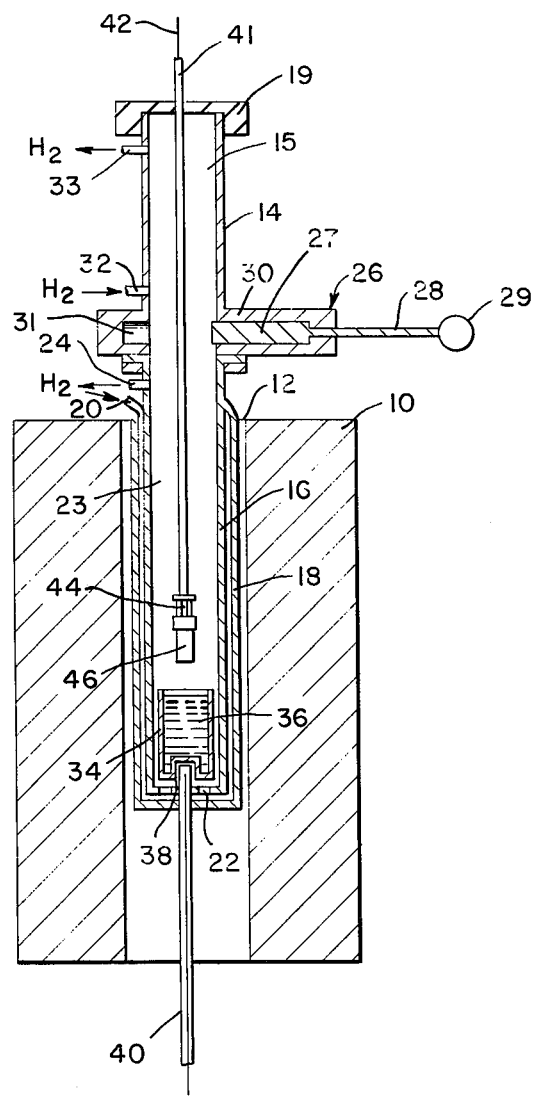
FIG. 1 is a schematic diagram illustrating generally the liquid phase epitaxial dipping technique according to the present invention.

A high vacuum valve member, designated generally 26, includes a main valve diaphram member 27 formed integral with a push rod 28 and a handle 29 which are used to move the member 27 horizontally within the valve case 30. As is explained in more detail below, the valve diaphram member 27 is moved from right to left as shown in FIG. 1 into the left-hand chamber portion 31 of the valve case 30 as the LPE apparatus in FIG. 1 is being initially purified by $H_2$ gas. This is done in preparation for an epitaxial deposition process carried out in accordance with the present invention.

Two additional gas inlet and outlet valves 32 and 33 are also provided as shown in the upper chamber portion 15 of the LPE crystal growth housing 14 and are used to independently provide hydrogen gas into this top chamber portion 15 of the apparatus while the high vacuum valve 26 is in its closed position and in initial preparation of the apparatus for LPE crystal growth. When both chamber portions 15 and 23 have been purified by the continuous passing of $H_2$ therethrough, and with the valve 26 in its closed position, the vertical dipping rod and wafer holder (41 and 46) are inserted into the top chamber portion 15. Then, after the housing 14 has again been completely enclosed by the replacement of the top cover 19, the valve 26 is opened so that the wafer holder may be lowered into the lower chamber portion 23.

A standard crucible 34 is mounted by conventional means (not shown) in the lower chamber portion 23 of the LPE growth apparatus and includes a solution 36 of gallium arsenide in gallium whose temperature is carefully controlled by conventional adjustments to the standard heater portion (not shown) of the furnace 10. The crucible 36 includes a recessed portion 38 in the lower end thereof for receiving a thermocouple 40 which is utilized in the closed loop temperature control of the GaAs in Ga solution 36. This control is also accomplished using conventional closed loop temperature control techniques which are well known in the art.

A vertical dipping rod 41 which extends as shown centrally into the housing 14 includes within it a vertical adjustment rod 44, to be described, for positioning a substrate holder 46 in the gallium arsenide in gallium solution 36. The details of this holder 46 and the adjustment screw 44 cooperative therewith are described in further detail below.

Figure 2A:
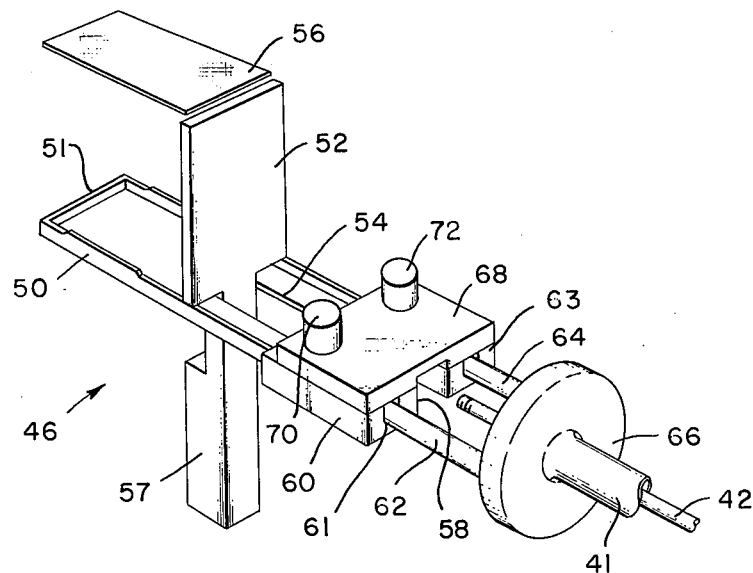
FIGS. 2a, 2b and 2c illustrate the technique of applying a gallium arsenide substrate to our substrate holder apparatus prior to dipping this apparatus vertically into the molten solution of FIG. 1.
Figure 2B:
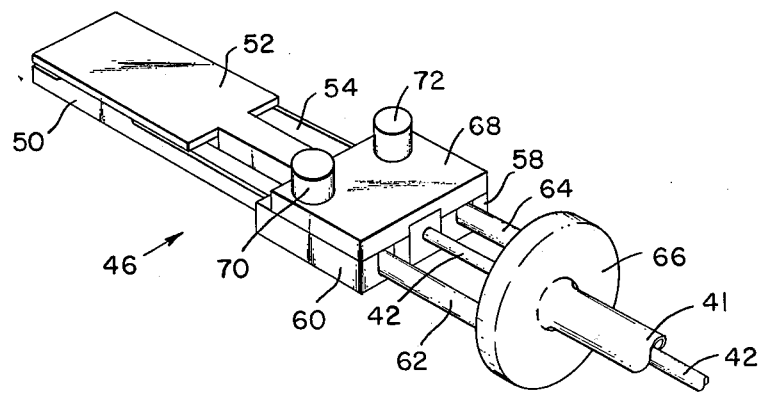
Figure 2C:
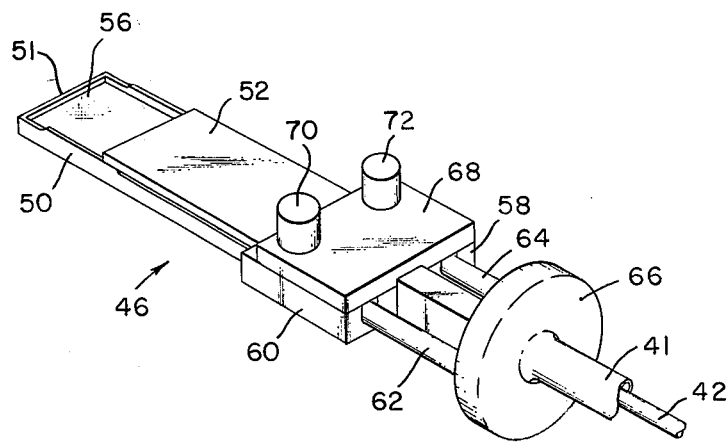

Referring now to FIGS. 2a through 2c, there is shown a semiconductor substrate holder, designated generally 46, which includes a main substrate support member 50 to which a rotatable cover member 52 is loosely received in an opening or slot 54. The substrate support member 50 is adapted to receive a gallium arsenide substrate 56 in the position indicated in FIG. 2a. Once the semiconductor substrate 56 is resting on the upper surface of the support member 50, the cover member 52 is rotated counterclockwise until the right-hand or handle portion 57 of the cover member 52 comes to rest within the slot 58 of a connecting end member 60 of the holder 46.

The end member 60 is integrally joined with the substrate support member 50 and includes a pair of passages 61 and 63 therein for receiving rods 62 and 64 respectively which are securely joined or fastened to a cylindrical plate 66. The rods 62 and 64 are configured to have L-shaped ends (not shown) which may initially be inserted into openings (also not shown) in the left side of the end member 60 of the holder 46. Then, the cover 68 is positioned as shown over the rods 62 and 64 and held in place by the screws 70 and 72. These screws 70 and 72 pass through the cover member 68 and threadedly engage the end member 60 in an offset position from the rods 62 and 64, thereby securely fastening the cover 68, the end member 60 and the rods 62 and 64 in place in preparation for an LPE crystal growth process.

The plate 66 has a central opening therein through which the vertical adjustment rod 42 extends into threadable engagement as shown in FIG. 2b with the right-hand handle portion 57 of the cover member 52. Thus, by merely pulling the vertical adjustment rod 42, the cover 52 can be withdrawn from left to right as shown in FIG. 2b to expose some or all of the gallium arsenide substrate 56, as indicated in FIG. 2c. Such substrate exposure is carried out, of course, after the substrate holder apparatus 46 has been immersed vertically into the gallium arsenide in gallium solution 36 in FIG. 1 and after substantial thermal equilibrium has been established between the solution 36 and the gallium arsenide substrate 56. This is accomplished while the substrate 56 is completely enclosed in the holder apparatus 46.

Once this thermal equilibrium condition has been reached, and the temperature of the solution 36 has been reduced to a level just where epitaxial growth from the solution 36 to the substrate 56 would begin to occur, the vertical adjustment rod 42 is pulled up to withdraw the cover 52 from the upper surface of the gallium arsenide substrate 56. The GaAs substrate 56 remains in position, of course, on the upper surface of the support member 50 as a result of the completely surrounding edges 51 of the support member 50 and because of the relative weights and densities of the substrate 56 and solution 36 respectively. At this point, liquid phase epitaxial growth in accordance with our invention begins.

Thus, the LPE process according to the present invention utilizes a large solution 36 which provides stable characteristics for producing a large number of gallium arsenide epitaxial layers at high yields. Such stability results in part from the fact that only a small amount of solute is taken out of the solution 36 with each epitaxial growth run. Additionally, the liquid matrix of the GaAs in Ga solution 36 provides a very uniform temperature and concentration therein, thus allowing the LPE growth of large area epitaxial layers which is essential to the high yield-low cost production of gallium arsenide devices. Moreover, the graphite slide bar assembly of FIGS. 2a, 2b and 2c helps further smooth out any temperature variations between solution and substrate as a result of the high thermal conductivity of graphite. This feature is very critical to layer thickness control, as well as to the control of doping levels in the process, both of which are sensitive to temperature variations.

The particular construction of the slide bar apparatus shown in FIGS. 2a, 2b and 2c allows the gallium arsenide substrate 56 to equilibrate with the solution temperature while submerged therein and before being exposed to the solution 36. Without this feature, the thermal shock at the substrate 56 when initially exposed to the solution 36 would cause imperfections at the epitaxial layer interface as previously mentioned. Additionally, while the substrate 56 is submerged in the solution 36 and equilibriating, and prior to epitaxial growth, the graphite assembly can be used as a stirrer to establish a homogeneous doping concentration profile in the solution 36. This feature further enhances uniform crystal nucleation and growth on the substrate when the substrate is eventually exposed to the solution. It is important to note that since only graphite is used in all parts of the apparatus disclosed in FIG. 1, such apparatus is fully useful to grow gallium aluminum arsenide and other semiconductors which are reactive to most other container materials and ambients.

Another important additional benefit of using the slide bar apparatus disclosed in FIG. 2 is that such apparatus enables a degree of supercooling to be established in the GaAs in Ga solution in cases where it becomes necessary to do so in order to prevent any etching of the gallium arsenide substrate. Such etching could lead to nonuniformities at the substrate-epitaxial layer interface, thereby making abrupt PN junctions therein difficult to obtain. Abrupt PN junctions can be obtained by avoiding such nonuniformities and are of substantial importance to the fabrication of semiconductor devices requiring abrupt or hyper-abrupt PN junctions.

In order to insure GaAs in Ga solution saturation, a polycrystalline gallium arsenide wafer (not shown) may be mounted on the backside side of the graphite assembly in FIG. 2 and the assembly then rotated during the initial equilibriation time. It is often difficult to pinpoint this exact saturation point, and the ability to establish it unequivocally using this additional GaAs polycrystalline wafer is preferred for applications such as growing thin GaAs layers less than about 0.2 micrometers for certain field effect transistor applications. It is important that the GaAs substrate 56 be exposed to the solution 36 when in equilibrium with the solute therein in order to insure reproducible process control in terms of time of growth. A supersaturated solution could lead to crystal growth which is too rapid and an undersaturated solution could cause etch back and nonuniformity of the grown epitaxial layer.

Because of the excellent epi layer thickness control that the present process provides, it opens up a new process field for growing gallium arsenide layers which exhibit optimum electrical and optical properties required of certain high performance devices such as field effect transistors, microwave diodes and solar cells. As previously noted, the present process enables one to grow thin layers of gallium arsenide with negligible or no substrate-epi layer PN junction irregularities, and this feature is highly desirable in the fabrication of devices such as FETs, microwave diodes and solar cells which are operatively dependent upon this PN junction characteristic. In the electronics industry, semiconductor structures used in the fabrication of these devices have been conventionally grown using vapor growth processes requiring high vapor pressure dopants, such as zinc and sulfur. However, it is preferable in many instances to use low vapor pressure dopants, such as germanium, tin and magnesium for the reason that these latter dopants are known to provide more stable PN junctions. Thus, the present process is especially well suited to meet this latter need, and our process additionally provides the process control essential to the production of sharp, uniform PN junctions. These junctions are now reproducible using the liquid epitaxy process of the present invention as a commercially viable alternative to vapor growth processes of the prior art.

The following process example provides details of one LPE process which has been successfully reduced to practice in accordance with our invention:

EXAMPLE

Initially, we prepare a saturated solution of GaAs in gallium by adding 25 grams of GaAs and 12 grams of tin (Sn) to 400 grams of liquid gallium. We then heated this saturated solution in its crucible shown in FIG. 1 to an elevated temperature on the order of about 810° C. The 12 grams of tin was determined in accordance with the known segregation coefficient of tin in a gallium solution, which is approximately $10^{-4}$.

Next, prior to the insertion of the vertical dipping rod into the crystal growth housing 14, the valve diaphram member 27 of the high vacuum valve 26 was closed by moving it to its left-hand position and into the chamber 31 as shown in FIG. 1. With the valve 26 thus closed, hydrogen gas, $H_2$, was passed into both gas inlet tubes 20 and 32 to provide a purified atmosphere in both the lower and upper chamber portions 23 and 15 respectively of the crystal growth housing 14. While the $H_2$ gas was passed continuously into both of these chamber portions of the crystal growth apparatus, the top of the housing 14 was removed and the dipping rod 42 and holder 46 were inserted into the upper chamber portion 23 of the apparatus. Then the top of the apparatus was put back on the housing 14, whereafter the valve 26 was opened by retracting its diaphram member 27 to the position shown in FIG. 1. The apparatus was thus readied for LPE growth while $H_2$ gas flow was continuously passed into both gas inlet tubes 20 and 32 and removed through the corresponding gas exit tubes 24 and 33, respectively.

Next, with a polycrystalline GaAs substrate mounted on the back of the graphite wafer holder, we lowered the wafer holder 46 including the enclosed GaAs substrate into the solution where the holder was utilized to stir the GaAs in gallium solution from between 2 and 3 hours to enhance uniformity and homogeneity in the solution composition. We then noted that the solution was equilibriating by observing the fact that no further change in weight was occurring in the polycrystalline GaAs wafer mounted on the back of the wafer holder.

At this point in the process, we reduced the temperature of the GaAs in gallium solution at a rate of about 0.1° C per minute for approximately 5 minutes to provide a net temperature change of approximately 0.5° C sufficient to start the growth of an epitaxial layer on the GaAs substrate. Then, we removed the graphite cover from the previously enclosed GaAs substrate to begin epitaxial layer growth on the GaAs substrate. The GaAs substrate was then exposed to the solution for about 10 minutes in order to grow an epitaxial layer of about 5 microns in thickness, or of a typical layer thickness for a field effect transistor channel region. Of course, the solution cooling rate and GaAs wafer exposure time can be varied by those skilled in the art in order to precisely control the epitaxial layer thickness. In fact, these parameters may be varied in order to grow very thin layers of epitaxial GaAs on the order of about 0.2 microns in thickness. In the present example, the 12 grams of Sn yielded a net N-type doping concentration in the grown epitaxial layer crystal of approximately $1 \times 10^{17}$ 10 atoms per cubic centimeter.

We have used other dopants, such as germanium as a P-type dopant, to provide P-type layers of epitaxial GaAs, and we have also used chromium as an additive to undoped N-type GaAs solutions to provided semi-insulating layers of N epitaxial GaAs which are quite useful in the fabrication of various semiconductor devices, such as Schottky gate field effect transistors.

What is claimed is:

1. A liquid phase epitaxial process for growing thin high quality epitaxial semiconductor layers on a substrate with good nucleation and growth at the epitaxial layer-substrate interface, comprising the steps of:
   a. providing a solution of a selected semiconductor material and at a predetermined elevated temperature;
   b. enclosing a selected semiconductor substrate in a nonreactive container of a material having a known high thermal conductivity;
   c. vertically immersing said container in said solution and maintaining said semiconductor substrate enclosed therein until substantial thermal equilibrium is established between said semiconductor substrate and said solution;
   d. bringing said solution to approximately its saturation equilibrium temperature at which epitaxial deposition would normally begin to occur in said solution; and then
   e. exposing said semiconductor substrate to said solution, whereby epitaxial growth on said substrate begins under conditions of substantial thermal equilibrium and substantial saturation equilibrium between said substrate and said solution.

2. The process defined in claim 1 wherein said semiconductor substrate is GaAs and said solution is GaAs in gallium doped with a predetermined amount of chromium sufficient to make epitaxial layers grown on said substrate semi-insulating and having a sheet resistivity greater than at least $10^5$ ohm·centimeters.

3. The process defined in claim 1 which further includes stirring said solution with said nonreactive container prior to exposing said substrate thereto in order to improve the uniformity of temperature throughout said solution and to improve the doping homogeneity therein, whereby epitaxial layers of substantially uniform electrical and optical properties are obtained.

4. The process defined in claim 1 wherein the exposure of said semiconductor substrate to said solution includes vertically withdrawing a graphite cover of said nonreactive container from one surface of said substrate while maintaining said substrate in position on a graphite support member of said container.

5. The process defined in claim 4 wherein said semiconductor substrate is GaAs and said solution is GaAs in gallium.

6. The process defined in claim 5 which further includes:

a. mounting another GaAs substrate on said nonreactive container to aid in equilibrating said solution, and
b. stirring said solution with said nonreactive container prior to exposing said substrate thereto in order to improve the uniformity of temperature throughout said solution and to improve the doping homogeneity therein, whereby epitaxial layers of substantially uniform electrical and optical properties are obtained.

* * * * *